United States Patent
Wang et al.

(10) Patent No.: US 10,541,356 B2
(45) Date of Patent: Jan. 21, 2020

(54) CHROMIUM NITRIDE THERMOELECTRIC MATERIAL AND PREPARATION METHOD THEREOF

(71) Applicant: University of Electronic Science and Technology of China, Chengdu, Sichuan (CN)

(72) Inventors: Chao Wang, Sichuan (CN); Junfeng Xia, Sichuan (CN); Jing Jiang, Sichuan (CN); Ting Zhou, Sichuan (CN); Yide Chen, Sichuan (CN); Yi Niu, Sichuan (CN); Rui Zhang, Sichuan (CN); Hanqing Tian, Sichuan (CN); Yan Pan, Sichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 0 days.

(21) Appl. No.: 15/936,442

(22) Filed: Mar. 27, 2018

(65) Prior Publication Data
US 2018/0240955 A1  Aug. 23, 2018

(30) Foreign Application Priority Data

Apr. 17, 2017  (CN) .......................... 2017 1 0247968

(51) Int. Cl.
*H01L 35/22* (2006.01)
*H01L 35/34* (2006.01)
*C01B 21/06* (2006.01)

(52) U.S. Cl.
CPC ............ *H01L 35/22* (2013.01); *C01B 21/062* (2013.01); *H01L 35/34* (2013.01)

(58) Field of Classification Search
None
See application file for complete search history.

(56) References Cited

PUBLICATIONS

Sun et al.; Facile Chemical Solution Deposition of Nanocrystalline CrN Thin Films with Low Magnetoresistance; The Royal Society of Chemistry; 2010.*

* cited by examiner

*Primary Examiner* — Guinever S Gregorio

(57) ABSTRACT

The present invention discloses CrN thermoelectric material and its preparation method, which belongs to the field of thermoelectric materials. Here, we provide a study for thermoelectric properties, hardness, wear-resisting performance and thermal stability of CrN. These results show that CrN possesses excellent mechanical properties and thermal stability. The hardness of the bulk CrN sample is as high as 735.76 HV, which is far superior to most of thermoelectric materials. The thermogravimetric analysis test indicates that CrN remain stable at 873 K. Friction and wear test results demonstrate that the low friction coefficient (~0.42) and good wear resistance of CrN. The maximum ZT value of 0.104 is observed at 848 K. In this way, CrN may be a promising thermoelectric material in extreme environment application which requires both mechanical and thermoelectric properties. Such as collision avoidance systems and outerspace.

3 Claims, 6 Drawing Sheets

```
┌─────────────────────────────────────────────────────────────┐
│ Cr(NO3)3.9H2O and PEG10000 were dissolved in deionized water│── 1
│ in a beaker and mix with ultrasonic for half an hour to      │
│ obtain solution A.                                           │
└─────────────────────────────────────────────────────────────┘
                              ↓
┌─────────────────────────────────────────────────────────────┐
│ Ammonia slowly into the solution A, the solution PH adjusted │
│ to 8-9, filtration, washing, separation obtained dark green  │── 2
│ precipitate. The precipitate was dried in a drying oven at   │
│ 60°C for 12 hours to obtain a dark green Cr(OH)3 powder.     │
└─────────────────────────────────────────────────────────────┘
                              ↓
┌─────────────────────────────────────────────────────────────┐
│ The dried Cr(OH)3 powder was annealed in a CVD tube furnace  │── 3
│ to obtain an dark green Cr2O3 powder.                        │
└─────────────────────────────────────────────────────────────┘
                              ↓
┌─────────────────────────────────────────────────────────────┐
│ The obtained Cr2O3 was nitrided with ammonia gas at a high   │── 4
│ temperature in a tube furnace to obtain a black CrN powder.  │
└─────────────────────────────────────────────────────────────┘
                              ↓
┌─────────────────────────────────────────────────────────────┐
│ The obtained CrN powder was loaded into graphite dies, and   │── 5
│ the bulk sample was obtained By hot-pressing.                │
└─────────────────────────────────────────────────────────────┘
```

Fig. 1

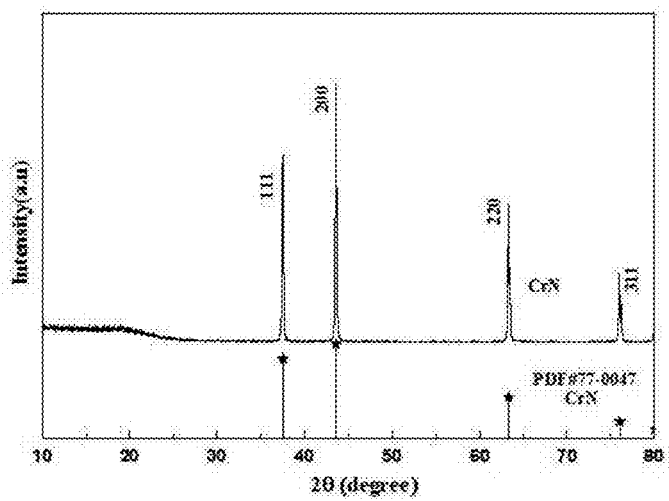

Fig. 2

CHROMIUM NITRIDE THERMOELECTRIC MATERIAL AND PREPARATION METHOD THEREOF

CROSS REFERENCE OF RELATED APPLICATION

The present invention claims priority under 35 U.S.C. 119(a-d) to CN 201710247968.8, filed Apr. 17, 2017.

BACKGROUND OF THE PRESENT INVENTION

Field of Invention

The present invention belongs to the field of thermoelectric materials, which relates to the preparation of CrN material and discusses its potential value in thermoelectric applications.

Description of Related Arts

Thermoelectric material is a kind of functional material which can convert thermal energy and electric energy from each other. Based on the seebeck effect and peltier effect, it can be used for thermoelectric power generation and static cooling, and has no pollution, no mechanical rotation, no noise and flexible installation. At present, thermoelectric materials have shown a trend of vigorous development in military, aerospace, industrial waste heat utilization, automobile exhaust waste heat utilization and other fields, and have great commercial potential.

The conversion efficiency of thermoelectric materials is evaluated by dimensionless figure of merit ZT ($ZT=S^2\sigma T/\kappa$), where S is the Seebeck coefficient, $\sigma$ is the electrical conductivity, T is the absolute temperature, and $\kappa$ is the thermal conductivity. The higher the ZT value, the higher conversion efficiency of thermoelectric materials. The recent emergence of high-ZT materials is encouraging. However, the material that can be applied on a large scale is scarce. Considering the working conditions of thermoelectric devices, the large temperature difference between the hot and cold side may lead to deformation and collapse of the device, which can greatly influence the efficiency and service life. Even the current commercial thermoelectric materials such as $Bi_2Te_3$ and PbTe includes these challenging aspects as well. In order to address these issues, materials with better mechanical properties and high thermal stability are needed.

CrN is usually prepared by reaction of metal chromium or chromium halide with ammonia in industry. The reaction usually takes a very long time (2 or 3 weeks), which is greatly reduces the production efficiency and economic benefit of the CrN industry. Other methods to preparation CrN such as mechanical alloying method, benzene hot method, high-energy ball mill method due to the long production cycle, the low purity and the harsh reaction conditions which are not suitable for mass production. Therefore, it is important to explore a quick and efficient method for the preparation of CrN.

SUMMARY OF THE PRESENT INVENTION

The present invention aims to provide a method for preparing high purity CrN and to evaluate its potential value in the field of thermoelectric applications. We systematically studied the thermoelectric properties, vickers hardness, wear resistance and thermal stability of CrN. As an alternative, CrN possesses many potential advantages. The high hardness, abrasion resistance and thermal stability may make it an important participant in the field of thermoelectric applications for some extreme environments in the future.

The technical proposal of the present invention is as follows: the application of CrN in the field of thermoelectric materials.

The preparation method of CrN thermoelectric material comprises the following steps:

Step 1: dissolving $Cr(NO_3)_3 \cdot 9H_2O$ (99.9%, aladdin) and PEG10000 (99%, aladdin) in deionized water and adding an obtained solution drop wise with $NH_3 \cdot H_2O$ under a magnetic stirrer, wherein the solution slowly turned dark green, indicating the formation of $Cr(OH)_3$ precursor; separating an obtained product from the solution by filtering and washing with alcohol and deionized water several times, and drying in a vacuum;

Step 2: calcining dried powder $Cr(OH)_3$ in a CVD tubular furnace to obtain $Cr_2O_3$ powder;

Step 3: nitriding the obtained $Cr_2O_3$ powder by passing ammonia gas into the CVD tube furnace to obtain black powder CrN; and Step 4: loading the obtained black powder CrN into graphite dies, wherein a bulk CrN sample is prepared by a homemade hot-pressing machine.

Further, as described in step 1, a ratio of $Cr(NO_3)_3 \cdot 9H_2O$, PEG10000, and the deionized water is 16.00 g: 8.00 g: 400 ml, a mixed ultrasonic time is 0.5-1 h, with static for 6-12 h, a dry temperature is 333 K, and a drying time is 12-24 h.

Further, as described in in the step 2, an annealing temperature is 773-973 K, and an annealing time is 2-4 h.

Further, as described in the step 3, a flow of ammonia is controlled at 100 to 200 ml/min, a nitriding temperature is controlled at 1073 to 1273 K for 8 to 12 hours. In addition, a hot pressing pressure described in the step 4 is 50-80 MPa, a sintering temperature is controlled at 973-1273 K for 10-30 min.

Further, a mould used in pressure sintering in the step 4 is a graphite mould; an inner wall of the graphite mould, a top and a bottom are padded with a piece of graphite paper so that the sample does not directly contact with the graphite mould during sintering; hot pressing is executed under a nitrogen atmosphere to prevent the sample from being oxidized.

The method for preparing CrN of the present invention has the advantages of simple process, greatly shortening the production preparation cycle and can be used for large-scale production.

These and other objectives, features, and advantages of the present invention will become apparent from the following detailed description, the accompanying drawings, and the appended claims.

BRIEF DESCRIPTION OF THE DRAWINGS

FIG. 1 is a schematic diagram of the preparation method of the bulk CrN thermoelectric materials provided by the present invention.

FIG. 2 is the X-ray diffraction pattern of CrN thermoelectric material for the implementation example.

DETAILED DESCRIPTION OF THE PREFERRED EMBODIMENT

FIG. 1 is a schematic diagram of the preparation method of the bulk CrN thermoelectric materials provided by the present invention.

FIG. 2 is the X-ray diffraction pattern of CrN thermoelectric material for the implementation example. The obtained samples are pure CrN material with the combination of CrN standard card PDF # 77-0047.

Figure 3:
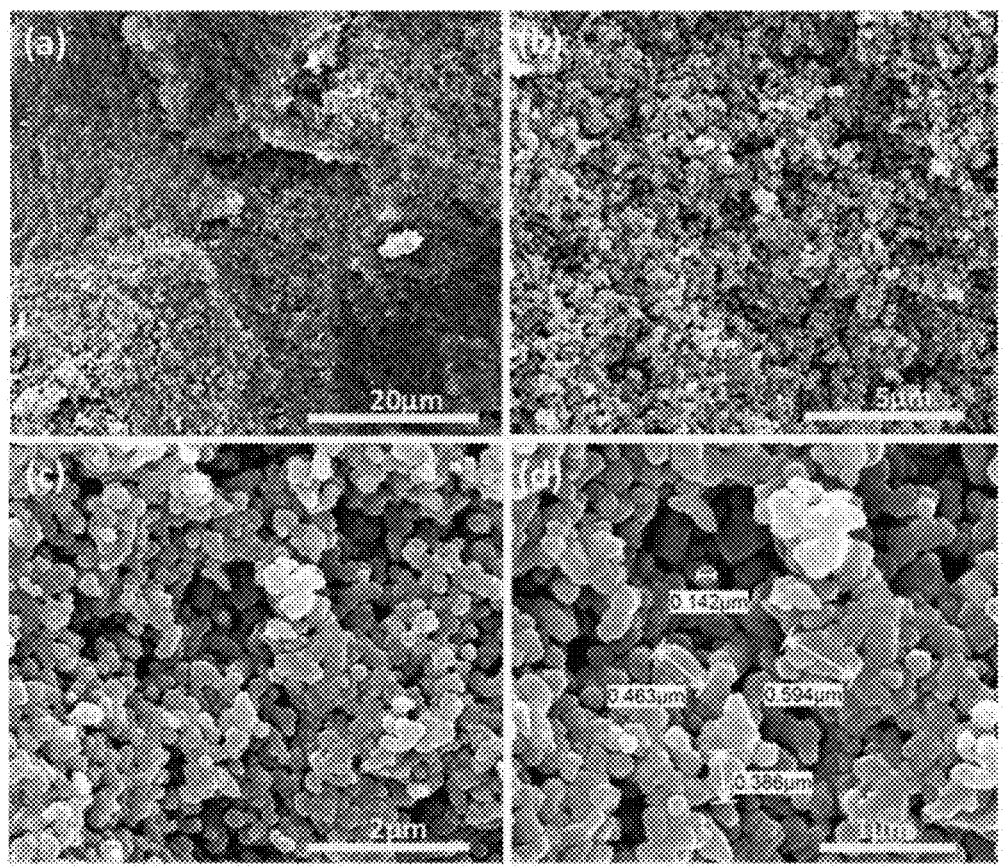
FIG. 3 is Scanning electron microscopy (SEM) images with different magnifications of bulk CrN sample for the implementation example.

FIG. 3 is Scanning electron microscopy (SEM) images with different magnifications of bulk CrN sample for the implementation example. (a) a scanning electron microscope that magnifies the sample by a factor of 5000, (b) a magnification of 200,000 times the sample, (c) a magnification of 500,000 times the sample, (d) a magnification of 80,000 times the sample. It can be seen that the sample comprises a large number of nanometer-sized grains with a diameter of about 300 to 400 nm.

Figure 4:
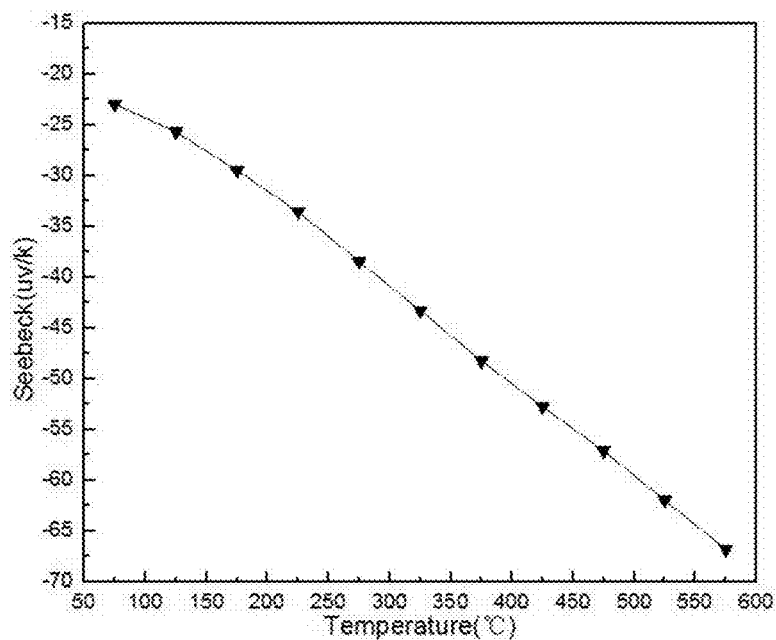
FIG. 4 shows the temperature dependence of the measured Seebeck coefficient of CrN bulk sample.

FIG. 4 shows the temperature dependence of the measured Seebeck coefficient of CrN bulk sample. The Seebeck coefficient increases with increasing temperature. At 848 K, the Seebeck coefficient reaches −67 uv/K.

Figure 5:
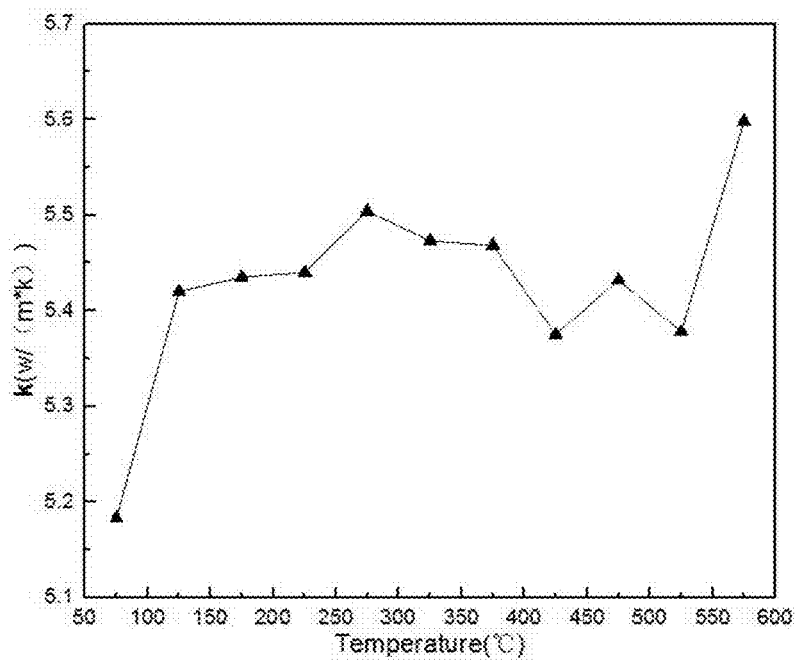
FIG. 5 reveals the temperature dependence of the measured thermal conductivity of CrN bulk sample.

FIG. 5 reveals the temperature dependence of the measured thermal conductivity of CrN bulk sample.

Figure 6:
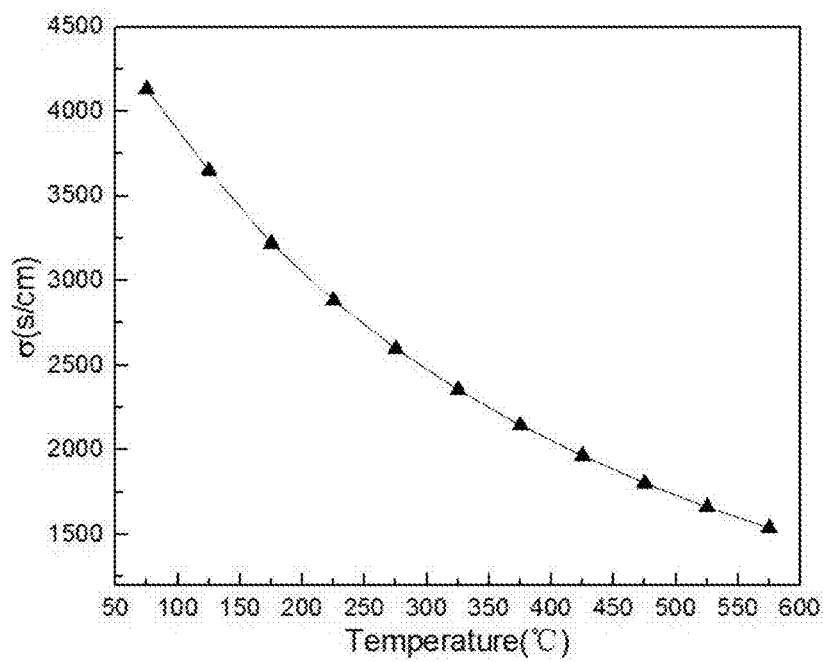
FIG. 6 demonstrates the temperature dependence of the measured electrical conductivity of CrN bulk sample.

FIG. 6 demonstrates the temperature dependence of the measured electrical conductivity of CrN bulk sample. The electrical conductivity of the sample decreases with increasing temperature and has similar metal properties.

Figure 7:
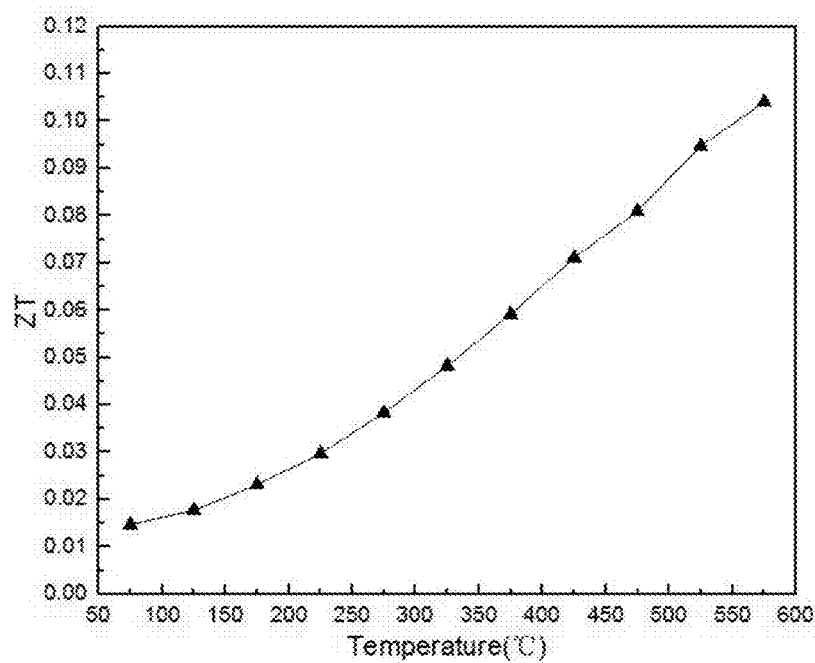
FIG. 7 demonstrates the temperature dependence of the ZT value of CrN bulk sample.

FIG. 7 demonstrates the temperature dependence of the ZT value of CrN bulk sample. The max ZT value of 0.104 was obtained at 848 K.

Figure 8:
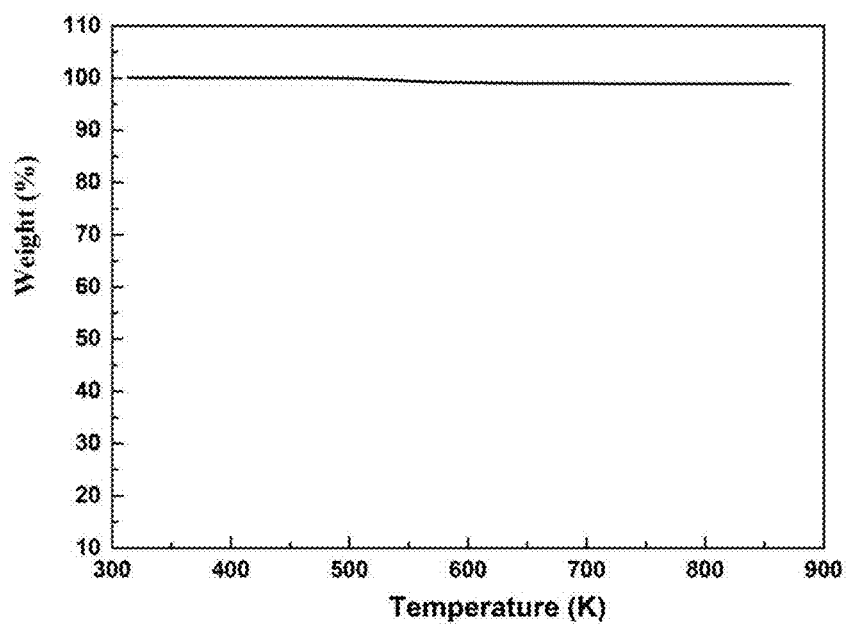
FIG. 8 demonstrates the results of thermogravimetric analysis (TGA) of the CrN bulk sample.

FIG. 8 demonstrates the results of thermogravimetric analysis (TGA) of the CrN bulk sample. The mass is essentially constant over the entire test temperature range, which indicates the high thermal stability of CrN sample.

Figure 9:
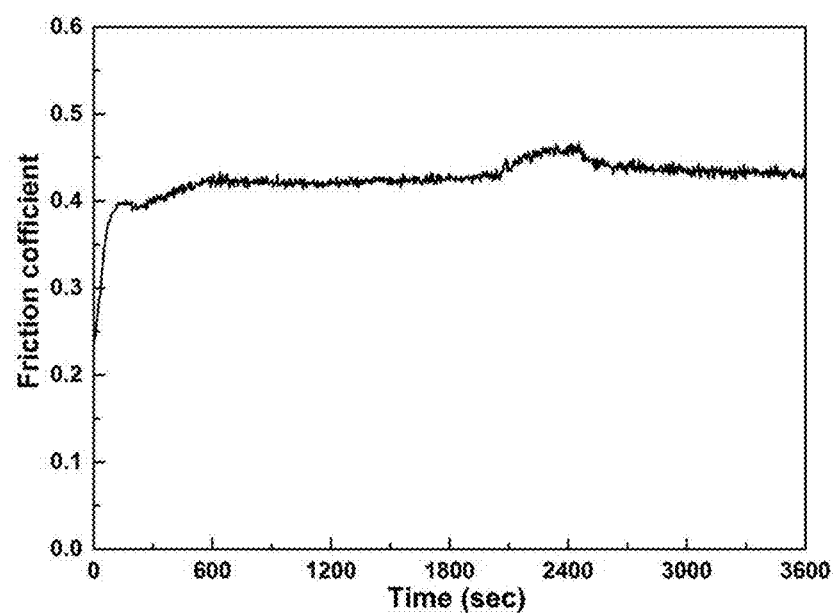
FIG. 9 demonstrates the change curve of friction coefficient with wear time of CrN sample.

FIG. 9 demonstrates the change curve of friction coefficient with wear time of CrN sample. In the friction process, the friction coefficient fluctuates from 0.25 to 0.45.

With protracted testing time, the friction coefficient of CrN tends to be a constant (~0.42). This is because abrasive particles continue to increase at the beginning of the friction experiment, resulting in a significant increase in friction coefficient. When the friction process tends to be stable, the friction coefficient remains at a stable level, the material exhibits significant abrasion resistance and lubricity.

Figure 10:
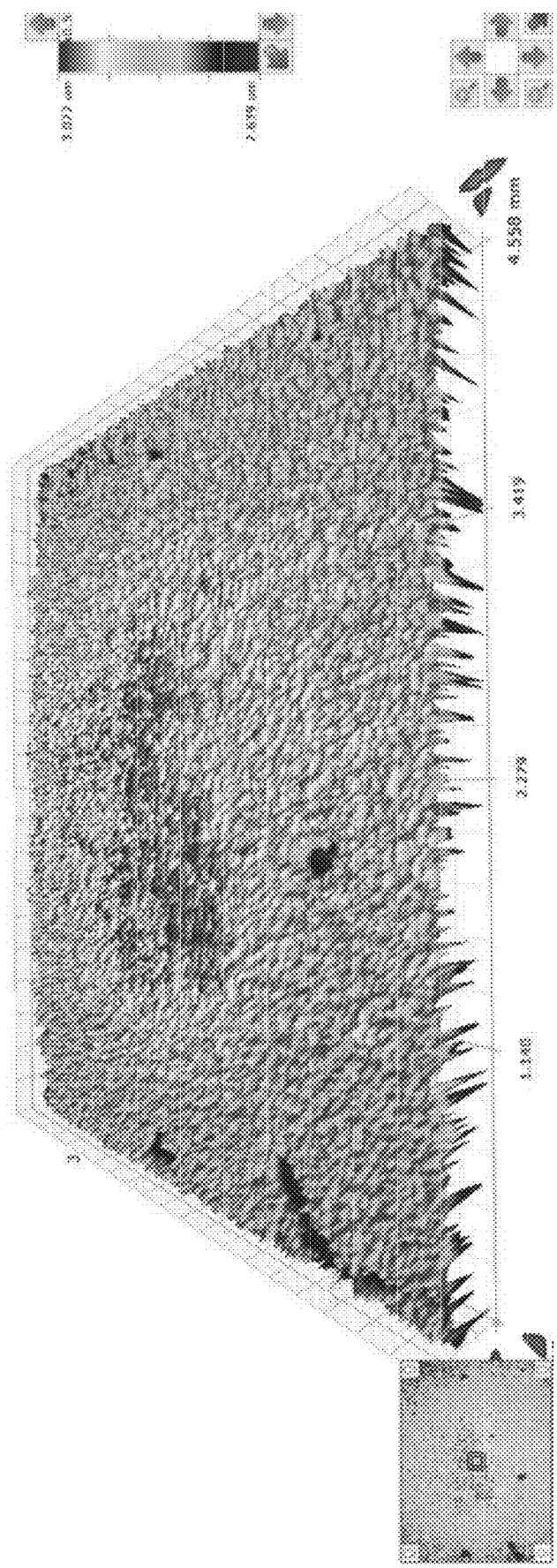
FIG. 10 demonstrates the wear resistance profile of the CrN sample substrate.

FIG. 10 demonstrates the wear resistance profile of the CrN sample substrate. It is worth noting that, after the 1 hour friction test the minimum and maximum depths of the wear trajectories are 3.1 and 7.6 μm, respectively, the wear marks are very smooth, and there is no sign of serious wear in the center of the wear track.

Table 1 shows the hardness tests of bulk CrN sample. The vickers hardness value of bulk CrN sample is 735.76 HV. This hardness value is much higher than many other commonly used thermoelectric materials such as PbTe (45 HV), $Bi_2Te_3$ (62.6 HV) and $Zn_3Sb_4$ (162 HV). The high hardness, abrasion resistance and thermal stability of CrN make it a great potential for thermoelectric applications in extreme environment.

TABLE 1

| The hardness tests of bulk CrN sample | | | | |
|---|---|---|---|---|
| Number of tests | 1 | 2 | 3 | 4 |
| Hardness (HV) | 724.95 | 742.64 | 730.79 | 742.64 |
| Average Hardness (HV) | | 735.76 | | |

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, the present invention includes all modifications encompassed within the spirit and scope of the following claims.

What is claimed is:

1. A method for preparing a CrN thermoelectric material, comprising steps of:

Step 1: dissolving $Cr(NO_3)_3 \cdot 9H_2O$ and PEG10000 in deionized water and adding an obtained solution drop wise with $NH_3 \cdot H_2O$ under a magnetic stirrer, wherein the solution slowly turned dark green, indicating the formation of $Cr(OH)_3$ precursor; separating an obtained product from the solution by filtering and washing with alcohol and deionized water several times, and drying in a vacuum;

Step 2: calcining dried powder $Cr(OH)_3$ in a CVD tubular furnace to obtain $Cr_2O_3$ powder;

Step 3: nitriding the obtained $Cr_2O_3$ powder by passing ammonia gas into the CVD tube furnace to obtain black powder CrN; and Step 4: padding an internal wall, a top and a bottom of graphite dies with a piece of graphite paper, and loading the obtained black powder CrN into the graphite dies; hot-pressing the black powder CrN in the graphite dies under a nitrogen atmosphere with a hot-pressing pressure of 50-80 MPa, and then sintering with a sintering temperature of 973-1273 K and a sintering time of 10-30 min, so as to form the CrN thermoelectric material.

2. The method for preparing the CrN thermoelectric material, as described in claim 1, wherein in the step 1, a proportion of $Cr(NO_3)_3 \cdot 9H_2O$, PEG10000, and the deionized water is: 16.00 g: 8.00g: 400 ml, a hybrid ultrasonic time is 0.5-1 h, with let stand for 6 to 12 h, a drying temperature is 333 K, and a drying time is 12-24 h.

3. The method for preparing the CrN thermoelectric material, as described in claim 1, wherein in the step 2, an annealing temperature is 773-973 K, and an annealing time is 2-4 h.

* * * * *